United States Patent [19]

Kuroda

[11] Patent Number: 5,562,223

[45] Date of Patent: Oct. 8, 1996

[54] CASING FOR A MINIATURE PORTABLE APPARATUS

[75] Inventor: Mitsuru Kuroda, Tokyo, Japan

[73] Assignee: NEC Corporation, Japan

[21] Appl. No.: 587,738

[22] Filed: Jan. 19, 1996

Related U.S. Application Data

[63] Continuation of Ser. No. 157,690, Nov. 24, 1993, abandoned.

[30] Foreign Application Priority Data

Nov. 27, 1992 [JP] Japan ................................ 4-318715

[51] Int. Cl.⁶ ...................................................... B65D 6/00
[52] U.S. Cl. ......................... 220/4.21; 220/4.24; 220/4.27
[58] Field of Search ................................ 220/4.21, 4.24, 220/4.02, 306

[56] References Cited

U.S. PATENT DOCUMENTS

| | | | |
|---|---|---|---|
| 3,149,747 | 9/1964 | Burgess | 220/4.21 X |
| 3,360,152 | 12/1967 | Leers | 220/4.21 X |
| 4,333,580 | 6/1982 | Sweigart, Jr. | 220/4.21 X |
| 4,654,631 | 3/1987 | Kurcbart et al. | |
| 4,925,045 | 5/1990 | Logsdon | 220/4.24 |
| 5,042,674 | 8/1991 | Ramsay et al. | 220/4.27 X |
| 5,207,342 | 5/1993 | Tsuji et al. | 220/4.21 X |
| 5,332,114 | 7/1994 | Sano et al. | 220/4.24 |

FOREIGN PATENT DOCUMENTS 2234128A  1/1991  United Kingdom.

OTHER PUBLICATIONS

European Search Report.

*Primary Examiner*—Steven M. Pollard
*Attorney, Agent, or Firm*—Laff, Whitesel, Conte & Saret, Ltd.

[57] ABSTRACT

A casing for a pager or similar miniature portable apparatus is made up of a box-like case and a cover removably fitted on the case. The case is provided with ribs having a generally I-shaped cross-section and ribs having a generally L-shaped cross-section. The I- and L-shaped ribs alternate with each other. The cover is provided with ribs having a generally U-shaped cross-section and recesses which mate with the I-shaped ribs and the L-shaped ribs of the case, respectively.

7 Claims, 5 Drawing Sheets

5,562,223

1

CASING FOR A MINIATURE PORTABLE APPARATUS

This application is a continuation of application Ser. No. 08/157,690, filed Nov. 24, 1993, abandoned.

BACKGROUND OF THE INVENTION

The present invention relates to the structure of a casing for a radio pager, radio telephone or similar miniature portable apparatus.

Portable apparatuses which are miniature and light weight are extensively used today and include radio pagers and radio telephones. This kind of apparatus has a casing accommodating various functioning parts. The casing has customarily been made up of a box-line case storing the functioning parts, and a cover covering the open end of the case. To couple the case and cover, a rib provided on the case and a rib provided on the cover are caused to mate with each other, and then the case and cover are fastened by, for example, a screw.

The problem with the conventional casing described above is that when a torsional load or similar unexpected load acts on the casing, the cover is apt to shift relative to the casing or even to separate from the casing.

SUMMARY OF THE INVENTION

It is, therefore, an object of the present invention to provide a casing for a miniature portable apparatus which prevents a case and a cover thereof from displacing or separating from each other even when an unexpected load acts thereon.

A casing for a miniature portable apparatus of the present invention has a box-like case open at one end thereof and having a plurality of first ribs and a plurality of second ribs arranged on and along one of four sides defining the square open end of the case. The first ribs and the second ribs alternate with each other, and each has a particular cross-section. A cover has a plurality of third ribs and a plurality of fourth ribs configured and positioned to mate with the first ribs and the second ribs, respectively.

BRIEF DESCRIPTION OF THE DRAWINGS

The above and other objects, features and advantages of the present invention will become more apparent from the following detailed description taken with the accompanying drawings in which.

2

Figure 8A:
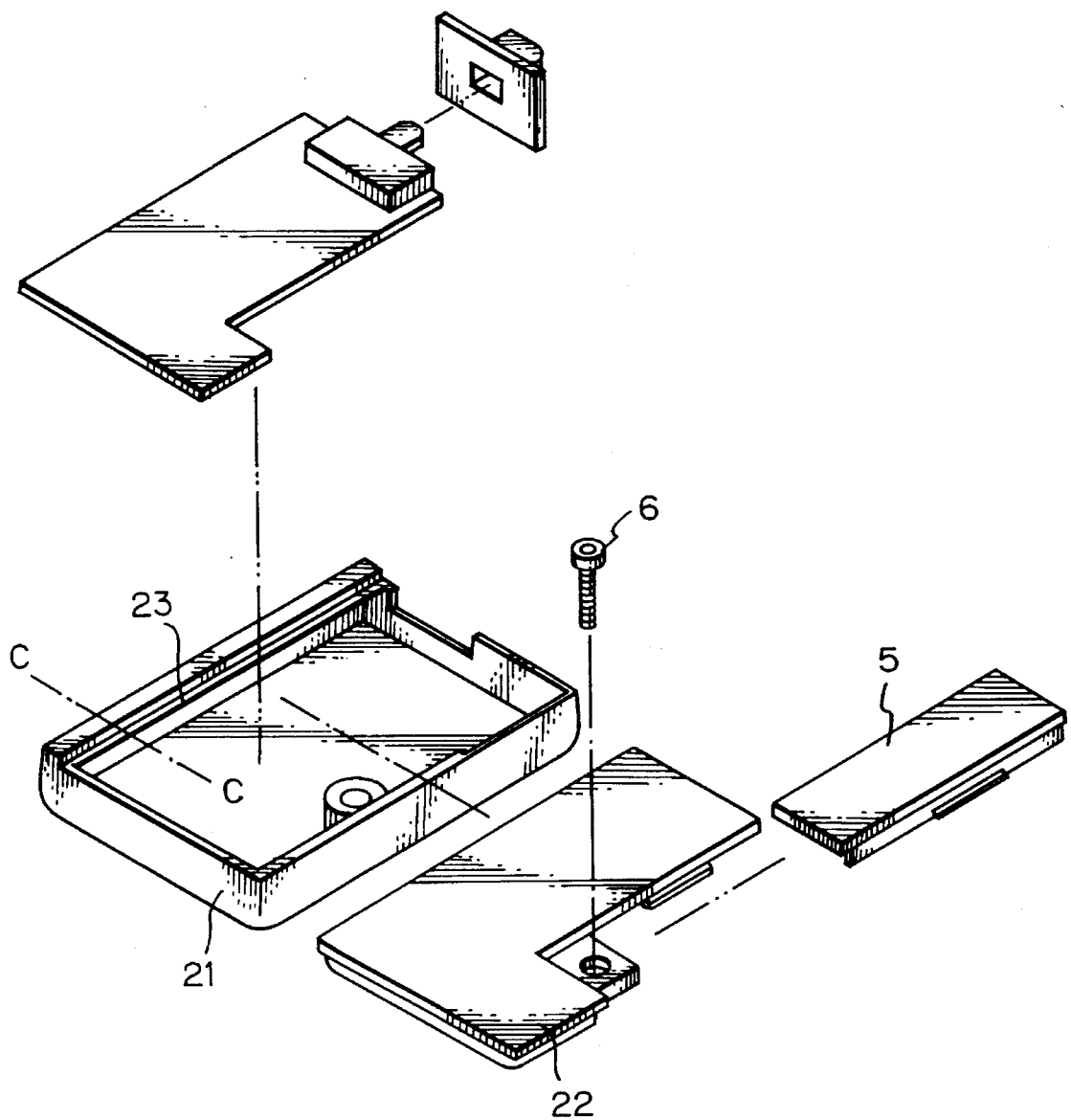

FIG. 8A is an exploded perspective view of a conventional casing; and

Figure 8B:
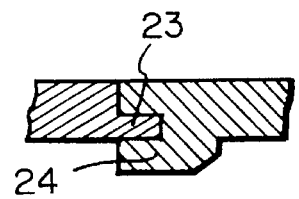

FIG. 8B is a section along line C—C of FIG. 8A.

DESCRIPTION OF THE PREFERRED EMBODIMENTS

To better understand the present invention, a brief reference will be made to a conventional casing for a radio pager or similar miniature portable apparatus, shown in FIGS. 8A and 8B. As shown in FIG. 8A, the casing is made up of a box-like case 21 and a cover 22 covering the open top of the case 21 and separable from the case 21. The case 21 is formed with a rib 23 having a generally I-shaped cross-section at one end thereof. As shown in FIG. 8B, the cover 22 is provided with a rib 24 having a generally U-shaped cross-section on the rear thereof. The rib 24 is so positioned as to mate with the rib 23. To fit the cover 22 on the case 21, the cover 22 is brought into the case 21 obliquely downward until the edge of the rib 24 abuts against the rib 23. Then, the cover 22 is rotated downward to cause the rib 24 to receive the rib 23 therein, as shown in FIG. 8B. Subsequently, the cover 22 is fastened to the case 21 by a screw 6 at the end thereof remote from the ribs 21 and 23. In FIG. 8A, the reference numeral 5 designates a battery cover.

As stated above, the case 21 and cover 22 are coupled simply with their I-shaped rib 23 and U-shaped rib 24 mating with each other. This brings about a problem that when a torsional load or similar unexpected load acts on the casing, the cover 22 is displaced or even removed from the case 21, as discussed earlier.

Figure 1:
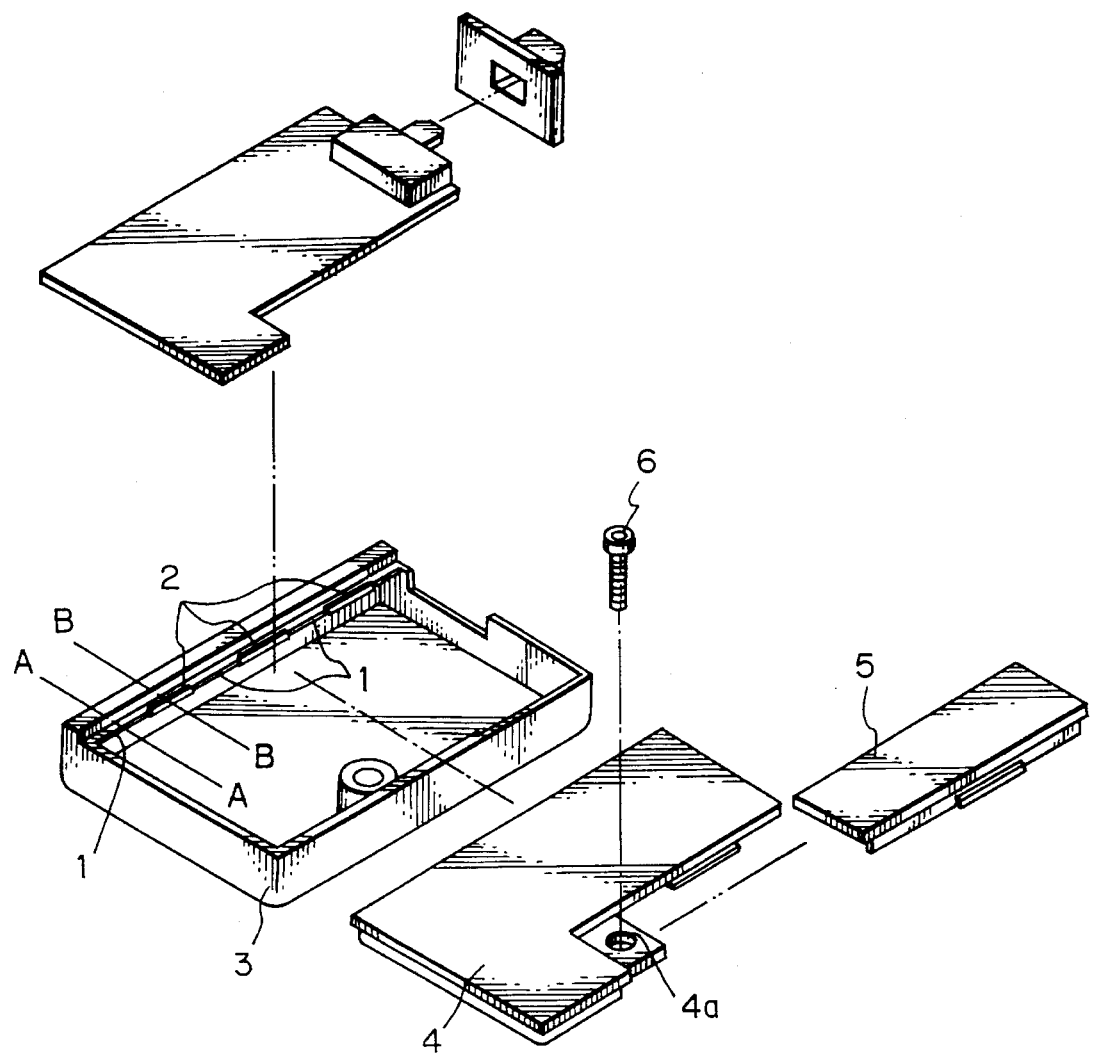
FIG. 1 is an exploded perspective view of a casing embodying the present invention.

Referring to FIG. 1, a casing embodying the present invention is shown. As shown, the casing has a box-like case 3 and a cover 4 covering the open top of the case 3 and separable from the case 3. The case and cover 4 are coupled together with ribs thereof, which will be described, mating with each other, thereby forming the casing. A battery cover 5 is removably fitted on the cover 4. The cover 4 is formed with a hole 4a to be fastened to the case 3 by a screw 6.

Figure 2A:
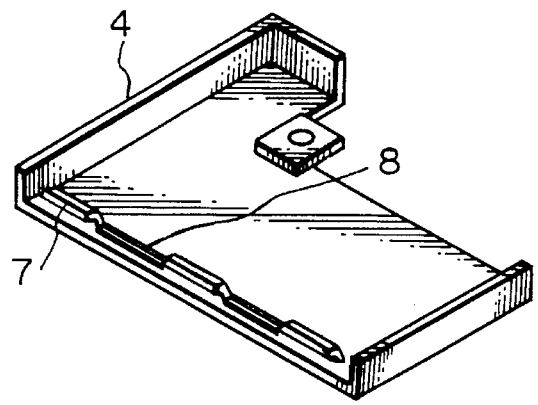
FIG. 2A is a perspective view of a cover forming part of the embodiment, as seen from the rear.
Figure 2B:
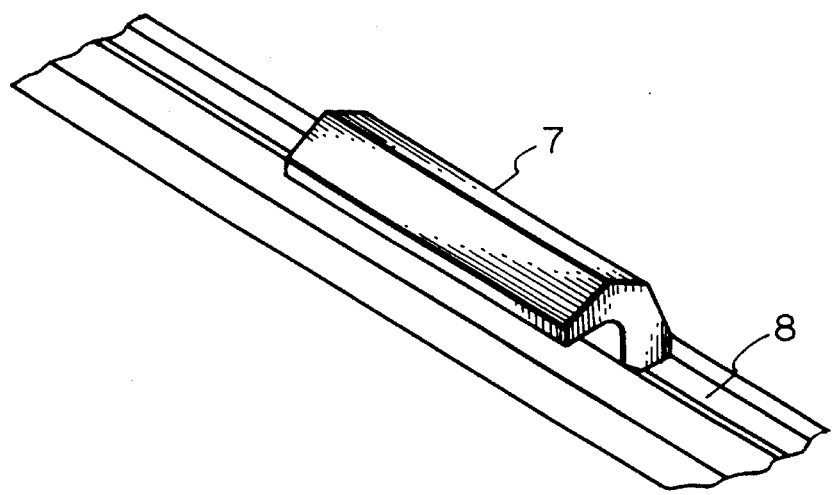
FIG. 2B is a fragmentary enlarged view of ribs provided on the cover.

As shown in FIGS. 1, 2A and 2B, the case 3 has a plurality of ribs 1 having a substantially I-shaped cross-section, and a plurality of ribs 2 having a substantially L-shaped cross section. The ribs 1 and the ribs 2 alternate with each other on one end of the case 3. On the other hand, the cover 4 has a plurality of ribs 7 having a substantially U-shaped cross-section and a plurality of recesses 8. The ribs 7 and the recesses 8 alternate with each other on one end of the cover 4 and are so shaped and positioned as to mate with the ribs 1 and the ribs 2, respectively.

Figure 3A:
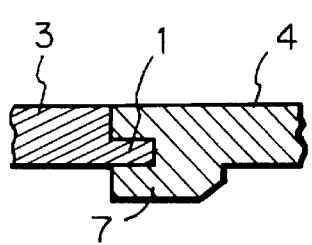
FIGS. 3A and 3B are sections along lines A—A and B—B of FIG. 1, respectively.
Figure 3B:
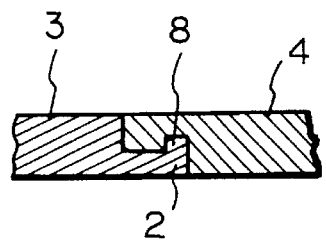
Figure 4A:
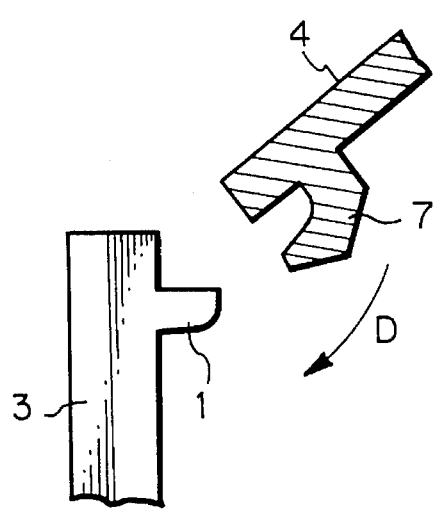
FIGS. 4A and 4B are views demonstrating how to set up the engaged conditions shown in FIGS. 3A and 3B.
Figure 4B:
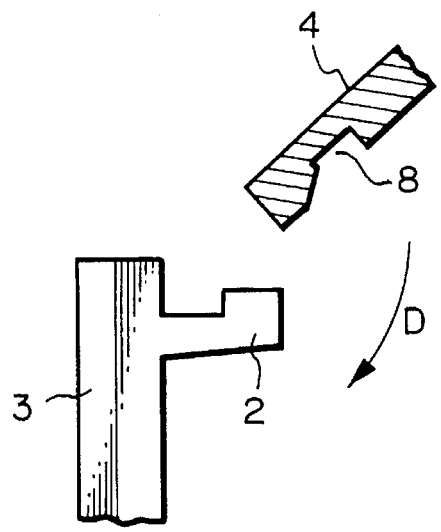

FIGS. 4A and 4B demonstrate how the case 3 and cover 4 are coupled with each other. As shown, the cover 4 is brought into the case 3 obliquely downward until the edges of the ribs 7 thereof abut against the ribs 1 of the case 3. At this instant, the recesses 8 of the cover 4 each covers respective one of the ribs 2 of the case 3 obliquely downward. Subsequently, the cover 4 is rotated in a direction indicated by an arrow D until the ribs 1 and 7 and the ribs 2 and recesses 8 mate each other, as shown in FIGS. 3A and 3B. Then, the other end of the cover 4 remote from the ribs 4 and recesses 8 is lowered into the case 3. Finally, the case 3 and cover 4 are fastened together by the screw 6.

Figure 5:
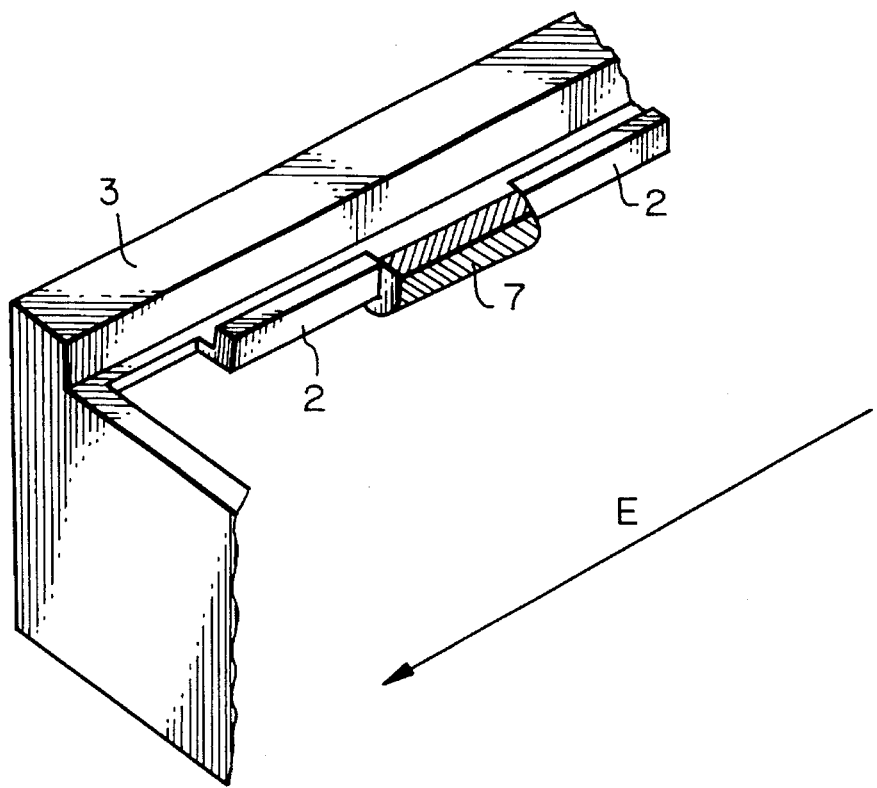
FIG. 5 is a fragmentary perspective view representative of the mating condition of the embodiment.

Assume that a force tending to separate the cover 4 from the case 3 or to produce a gap between the cover and the case 3 acts on the casing. Then, the U-shaped ribs 7 of the cover 4 are apt to move in the right-and-left direction as viewed in FIG. 3A. However, such a displacement of the ribs 7 is prevented by the engagement shown in FIG. 3B. Likewise, although the recesses 8 are apt to move upward as viewed in FIG. 3B, the engagement shown in FIG. 3A prevents it from doing so. Further, assume that a torsional load acts on the casing, as indicated by an arrow E in FIG. 5. In this case, since the L-shaped ribs 2 and the U-shaped ribs 7 alternate with each other in the longitudinal direction, they interfere with each other to prevent the cover 4 from moving and, in addition, enhances the torsional strength of the entire casing.

Figure 6A:
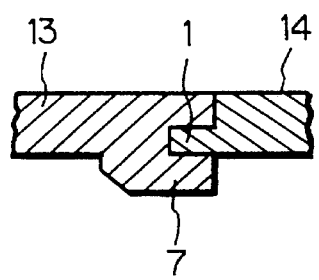
FIGS. 6A and 6B are sections showing an alternative embodiment of the present invention.
Figure 6B:
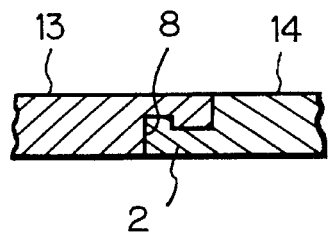
Figure 7A:
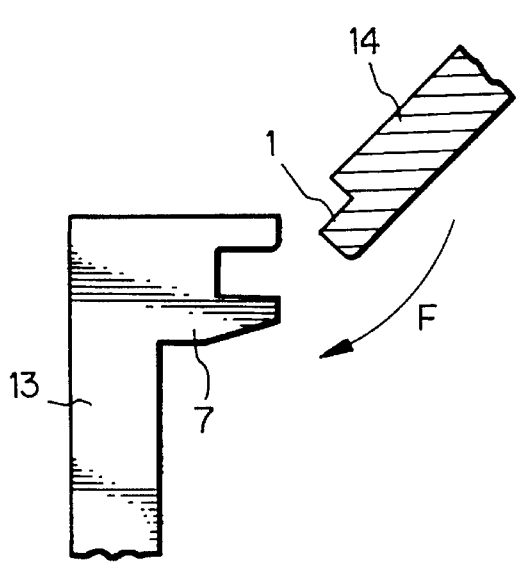
FIGS. 7A and 7B are views demonstrating how to set up engaged conditions shown in FIGS. 6A and 6B.
Figure 7B:
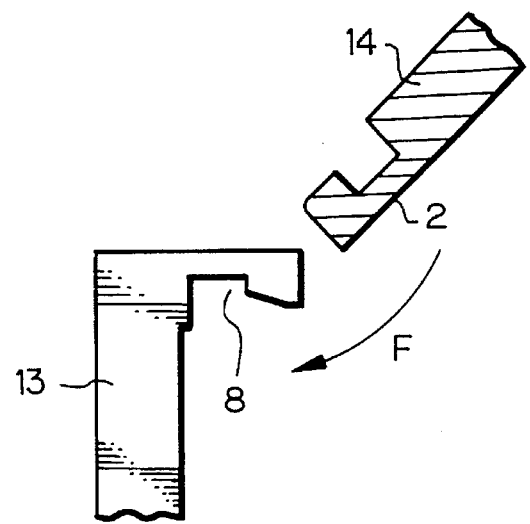

Referring to FIGS. 6A and 6B, an alternative embodiment of the present invention will be described which is similar to the previous embodiment except for the arrangement of ribs and recesses. As shown, a case 13 has the U-shaped ribs 7 and recesses 8 which alternate with each other, while a cover 14 has the I-shaped ribs 1 and L-shaped ribs 2 which also alternate with each other. As shown in FIGS. 7A and 7B, the cover 14 is brought into the case 13 obliquely downward until the ribs 1 and ribs 2 thereof abut against the ribs 7 and 8, respectively. Subsequently, the cover 14 is rotated in a direction indicated by an arrow F to couple it to the case 13, as shown in FIGS. 6A and 6B.

In the illustrative embodiments, the edges of the ribs are rounded or tapered, so that they can be mated easily. The cases 3 and 13 and covers 4 and 14 may each be made of plastics or similar elastically deformable material to further enhance the easy mating operation.

In summary, in accordance with the present invention, a casing for a miniature portable apparatus is made up of a case and a cover covering the open top of the case. The case and the cover are each provided with two kinds of ribs alternating with each other. The ribs of the case and those of the cover are different in cross-section and mate with each other. Hence, the strength of the casing against torsion or similar load is noticeably increased. Further, when the casing is let fall by accident, the case and cover are prevented from separating from each other. In addition, the gap between the abutting portions of the case and cover is reduced to provide the casing with attractive appearance.

Various modifications will become possible for those skilled in the art after receiving the teachings of the present disclosure without departing from the scope thereof.

What is claimed is:

1. A casing for a miniature portable apparatus, comprising:
   a box-like case open at one end thereof and comprising a plurality of first ribs and a plurality of second ribs arranged on and along one of four sides defining a square open end of said case, said plurality of first ribs and said plurality of second ribs alternating with each other and each having a different particular cross-section, said first and second ribs having a predetermined contours; and
   a cover comprising a plurality of third ribs and a plurality of fourth ribs, said third and fourth ribs having contours which are configured and positioned to complement, embrace and snugly clasp the predetermined contours of said plurality of first ribs and said plurality of second ribs, respectively.

2. A casing as claimed in claim 1, wherein said first ribs and said second ribs have respectively a substantially I-shaped cross-section and a substantially L-shaped cross-section, while said third ribs and said fourth ribs have respectively a substantially U-shaped cross-section and a recessed configuration so that said L-shape fits into the embrace and is clasped by said U-shape.

3. A casing as claimed in claim 1, wherein said first ribs and said second ribs have respectively a substantially U-shaped cross section and a recessed configuration, while said third ribs and said fourth ribs have respectively a substantially I-shaped cross section and a substantially L-shaped cross-section.

4. A miniature housing comprising a box and a cover; said box and cover having complementary peripheral contours so that they fit together to form a closed container; two types of interlocking rib connectors alternately distributed along said peripheral contours for holding said cover on said box; one of said types of said interlocking rib connectors having a first cross-sectional shape with complementary rib parts at said peripheral contours on said cover and said box, respectively, for resisting horizontal stress, the other of said types of said interlocking rib connectors having a second different cross-sectional shape with complementary rib parts at said peripheral contours on said covers and said box, respectively, for resisting vertical stress.

5. The housing of claim 4 wherein said one type of said connectors comprises a pair of complementary L-shaped ribs, one of said L-shaped ribs being on each of said cover and said box, each of said ribs having raised part at the toe of said L-shape, the raised toes on said L-shapes snapping over each other to join said two L-shapes in a mutual embrace in order to resist a separation in a horizontal direction.

6. The housing of claim 5 wherein said other type of said connector comprising a U-shaped part on one of said cover and said box, an open gap in said U-shape facing a second part, said second part comprising an I-shaped portion received in said gap when said connector is closed, said U-shape and said I-shape nesting when said connector is closed to resist separation in a vertical direction.

7. The housing of claim 4 wherein said one type of said connectors comprises a pair of complementary L-shaped ribs, one of said L-shaped ribs being on each of said cover and said box, each of said ribs having raised part at the toe of said L-shape, the raised toes on said L-shapes snapping over each other to join said two L-shapes in a mutual embrace in order to resist separation in a horizontal direction, and said other type of said connector comprising a U-shaped part on one of said cover and said box, an open gap in said U-shape facing a second part, said second part comprising an I-shaped portion received in said gap when said connector is closed, said U-shape and said I-shape nesting when said connector is closed to resist separation in a vertical direction.

\* \* \* \* \*